(12) United States Patent
Van Keer et al.

(10) Patent No.: US 9,666,290 B2
(45) Date of Patent: May 30, 2017

(54) FLASH MEMORY COUNTER

(71) Applicant: Proton World International N.V., Diegem (BE)

(72) Inventors: Ronny Van Keer, Hoeilaart (BE); Youssef Ahssini, Vilvoorde (BE)

(73) Assignee: Proton World International N.V., Diegem (BE)

( * ) Notice: Subject to any disclaimer, the term of this patent is extended or adjusted under 35 U.S.C. 154(b) by 0 days.

(21) Appl. No.: 15/182,411

(22) Filed: Jun. 14, 2016

(65) Prior Publication Data

US 2016/0293262 A1      Oct. 6, 2016

Related U.S. Application Data

(63) Continuation of application No. 14/522,007, filed on Oct. 23, 2014, now Pat. No. 9,390,804.

(30) Foreign Application Priority Data

Oct. 25, 2013   (FR) ..................... 13 60440

(51) Int. Cl.
  *G11C 11/34*   (2006.01)
  *G11C 16/14*   (2006.01)
  *G06F 12/02*   (2006.01)
  *G11C 16/34*   (2006.01)
  *G11C 16/20*   (2006.01)
  *G11C 16/26*   (2006.01)

(52) U.S. Cl.
  CPC .......... *G11C 16/14* (2013.01); *G06F 12/0246* (2013.01); *G11C 16/20* (2013.01); *G11C 16/26* (2013.01); *G11C 16/345* (2013.01)

(58) Field of Classification Search
  CPC .............................. G11C 16/14; G11C 16/08
  USPC .................... 365/185.17, 185.12, 185.25
  See application file for complete search history.

(56) References Cited

U.S. PATENT DOCUMENTS

| 5,675,622 | A | * | 10/1997 | Hewitt | ............... G07C 9/00182 377/26 |
| 5,901,225 | A | * | 5/1999 | Ireton | ..................... G06F 9/328 714/6.32 |
| 7,616,508 | B1 | | 11/2009 | Landrey et al. | |
| 2008/0183952 | A1 | * | 7/2008 | Rikitake | .............. G11C 16/349 711/103 |
| 2009/0259877 | A1 | | 10/2009 | Vyssotski et al. | |
| 2011/0292734 | A1 | | 12/2011 | Kim | |
| 2014/0362640 | A1 | | 12/2014 | Tailliet | |

FOREIGN PATENT DOCUMENTS

KR      10-2008-0064476 A      7/2008

OTHER PUBLICATIONS

French Search Report, dated May 28, 2014, for French Application No. FR1360440, 6 pages.

* cited by examiner

*Primary Examiner* — Han Yang
(74) *Attorney, Agent, or Firm* — Seed IP Law Group LLP

(57) ABSTRACT

A method of updating a counter in a flash memory includes a first phase where a set of values capable of being taken by the counter are programmed in at least one page of the flash memory. A second phase of updating the counter programs a state zero in the flash memory each time the counter is incremented/decremented.

20 Claims, 2 Drawing Sheets

FLASH MEMORY COUNTER

CROSS-REFERENCE TO RELATED APPLICATIONS

This application is a continuation of U.S. application Ser. No. 14/522,007, filed on Oct. 23, 2014, which claims the priority benefit of French Patent application number 13/60440, filed on Oct. 25, 2013, each of which are hereby incorporated by reference in their entirety.

BACKGROUND

Technical Field

The present disclosure generally relates to electronic circuits and, more specifically, to circuits using a flash memory. The present disclosure more specifically relates to the forming of a counter having its value stored in a flash memory.

Description of the Related Art

In many applications, the result of a counter needs to be non-volatilely stored so that it is conserved independently from the circuit power supply. Such is particularly the case in microcircuit cards which integrate a microprocessor and at least one non-volatile memory, and more generally in any electronic circuit requiring non-volatile memory counting elements.

Up to now, EEPROM-type memories are used to store the value of a counter.

BRIEF SUMMARY

Due to the development of flash-type memories, it would be desirable to be able to use such memories to store the values of counters.

However, a constraint is that flash-type memories can only be erased in full memory pages.

Thus, an embodiment aims at a method of updating a counter in a flash memory, comprising:

a first phase where a set of values capable of being taken by the counter are programmed in at least one page of the flash memory; and a second phase where, each time the counter is incremented/decremented, the current value is programmed to state zero in the flash memory.

According to an embodiment, the first phase comprises:

erasing the page from the memory; and writing, in a single operation, successive values of the counter in the page.

According to an embodiment, a reading of the counter value comprises sequentially examining the page content and considering the first non-zero value.

According to an embodiment, a page comprises 64, 128, or 256 bytes.

According to an embodiment, a flash memory programmed according to the above method is also provided.

According to an embodiment, an electronic circuit comprising such a flash memory is also provided.

The foregoing and other features and advantages will be discussed in detail in the following non-limiting description of specific embodiments in connection with the accompanying drawings.

DETAILED DESCRIPTION

Figure 1:
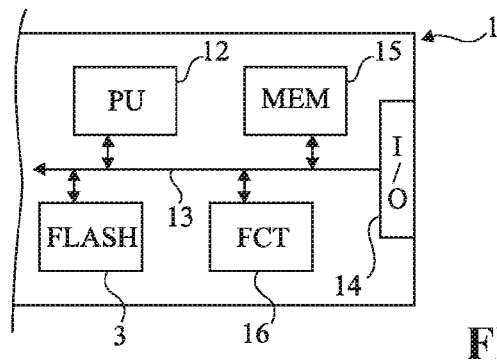
FIG. 1 is a block diagram of an example of electronic circuit of the type to which the embodiments which will be described apply.

The same elements have been designated with the same reference numerals in the different drawings. For clarity, only those acts and elements which are useful to the understanding of the embodiments which will be described have been shown and will be detailed. In particular, the electric behavior of a flash memory during write, read, and erase has not been detailed, the described embodiments being compatible with usual flash memory technologies. Further, applications using the updating of a counter to be stored in a flash memory have not been detailed either, the described embodiments being here again compatible with usual applications.

Using a flash memory to store a counter raises a plurality of issues relative to the current use of an EEPROM.

Conventionally, when a counter is stored in an EEPROM, the programming and the erasing are performed on bytes or on words in the memory, which provides enough granularity.

A flash memory is programmed from an initial state to states 0 (non-conductive states of the cells). This means that the memory cells should be set to a high state and that, to store a piece of data, it is chosen either not to act on the bit state, or to program this bit to 0.

Further, an erasing (setting back to the initial state) is necessarily performed on a whole memory page. A page is defined as being the minimum size capable of being simultaneously addressed to be erased. In practice, this corresponds to the size of a register receiving the data in series to transfer them in parallel to the memory plane for storage. Typically, a page currently amounts, in a flash memory, to 32, 64, 128, 256, or 512 bytes.

Now, a counter requires switching the state of a single bit (or of a few bits, according to the increment/decrement).

The page erasing operation is relatively long (typically in the order of a few milliseconds) with respect to a byte programming operation (typically in the order of some ten microseconds).

A process comprising erasing the page to program the new counter state for each increment would take too much time. In particular, in many applications, the time available to write into the non-volatile memory is limited. This is particularly true in applications using a contactless near-field communication technology (NFC) since the duration of the transaction between two communicating elements is only temporary and risks being interrupted at any time. Now, the use of a counter in a non-volatile memory is, in such applications, often in relation with safety issues in terms of access to certain data. The reliability of the counter is then critical. So-called atomic procedures may then have to be implemented to improve the reliability. However, such procedures further increase the need to update data in the non-volatile memory.

FIG. 1 schematically shows, in the form of blocks, an example of an electronic circuit 1 of the type to which the embodiments which will be described apply. Such a circuit comprises a processing unit 12 (PU) capable of communicating, via one or a plurality of data, address, and control buses 13, with different elements including, for example, an input/output interface 14 (I/O) of communication with the outside of circuit 1, one or a plurality of volatile or non-volatile memories 15 (MEM), one or a plurality of functions (symbolized by a block 16, FCT) associated with the application, and at least one flash memory 3 (FLASH). Other elements are capable of being connected to buses 13 and/or of being comprised in the circuit. The flash memory may be external to circuit 1.

Figure 2:
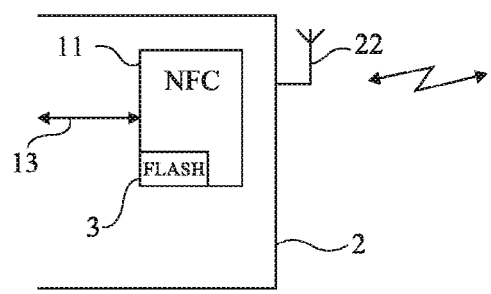
FIG. 2 very schematically illustrates in the form of blocks an example of a system using a near-field communication (NFC) router.

FIG. 2 is a simplified representation of an example of a device 2 comprising one or a plurality of electronic circuits 11 forming a near-field communication router (NFC) capable of communicating via different buses 13 with the rest of device 2. The NFC router is used as an interface between the different elements of device 2 and an antenna 22 of near-field communication with a neighboring device, not shown. In the example of FIG. 2, the NFC circuit comprises at least one flash memory 3.

The applications targeted by the present disclosure use at least one counter having its value stored in the flash memory.

Figure 3:
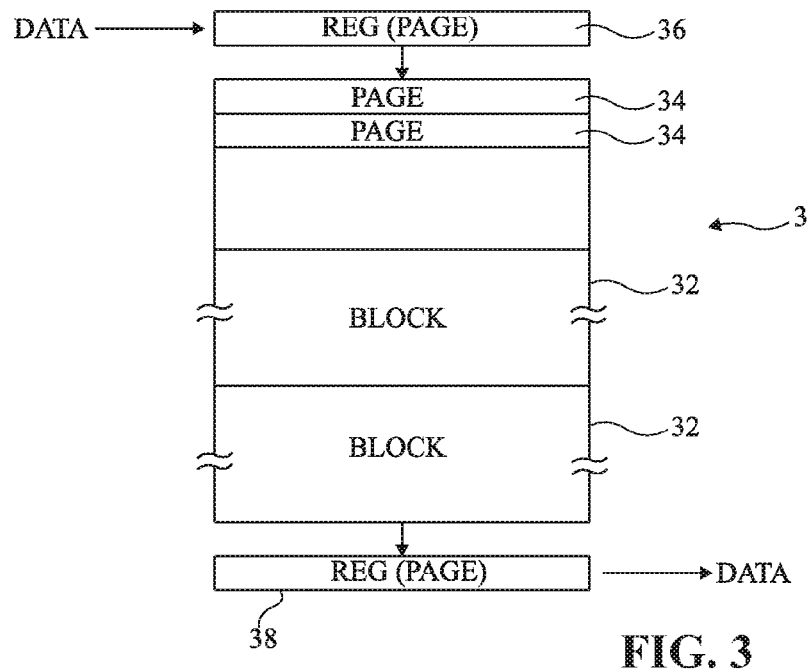
FIG. 3 is a simplified representation of an example of flash memory.

FIG. 3 very schematically illustrates an example of architecture of a flash memory 3, such a memory being generally organized in blocks 32 (BLOCK) each comprising a plurality of pages 34 (PAGE), each having a given number of bytes, for example, 512, 1,024, or 2,048 bytes. The writing of data DATA into memory 3 or the erasing are performed via an input register 36 (REG). The data are typically sent in a series communication, or in bytes, into write register 36, which is then discharged in parallel towards a block of the memory. In read mode, the addressing of an area also results in the reading of a page through an output register 38 which outputs the read data.

The representation of FIG. 3 is simplified and the different control and addressing circuits have not been illustrated.

The normal use of a flash memory to store data having a size smaller than one page would take too much time. Indeed, for each new value to be stored in the counter, it would be necessary to erase the entire page to be able to reprogram a new value.

In a counter initialization phase, an entire memory page is erased, after which all the expected values of the counter capable of being stored in this page are programmed. Once this page initialization is over, for each increment or decrement of the counter, the corresponding value in the page is programmed to zero. In read mode, the current value of the counter is given by the first addressed value (typically in the sequential order) which is not zero.

Figure 4:
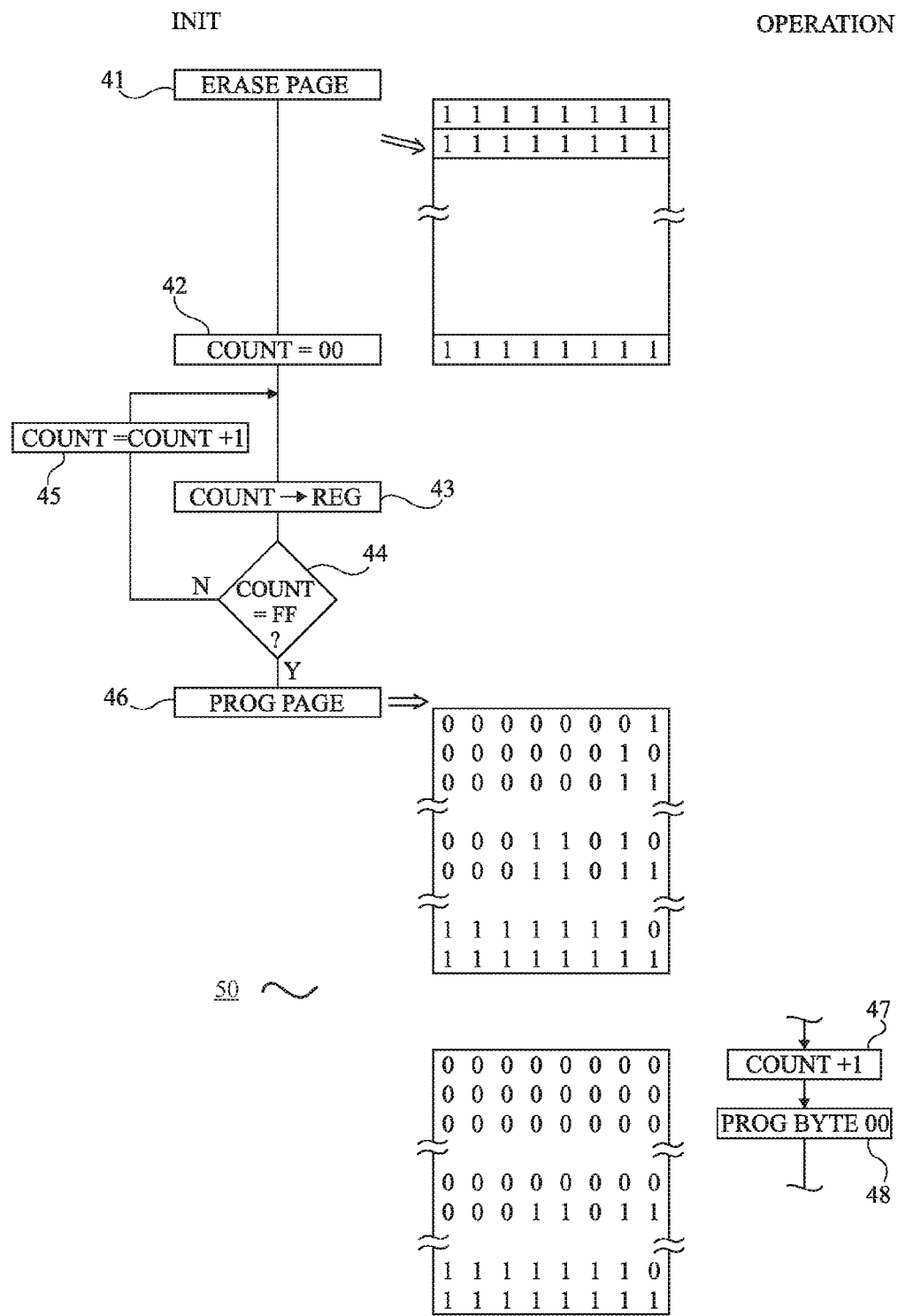
FIG. 4 illustrates an embodiment of the method of programming a counter in a flash memory.

FIG. 4 very schematically illustrates an embodiment of a method of updating a counter in a flash memory.

In a counter initialization phase (INIT), it is started by erasing (block 41, ERASE PAGE) the corresponding page in the memory, that is, by setting all the bits in the page to a state 1 (byte at value FF). Then, in a second act of the initialization phase, all the successive counter values are written in a single operation into the memory page. For example, the different values are generated in the RAM or in registers by successive increments or decrements of all the counter values. This act is illustrated in FIG. 4 by a block 42 (COUNT=00) of initialization of the counter value to 0 (byte at 00), and then by a loop (blocks 42 to 46) where the current value is stored (block 43, COUNT->REG) in a register preferably having the size of a page of the flash memory, a test (block 44, COUNT=FF?) being then performed to determine whether the maximum value of the counter has been reached. As long as all the values have not been calculated (output N of test 44), the counter is incremented (block 45, COUNT=COUNT+1). Once all values are present in the register (output Y of test 44), the content thereof is programmed in the flash memory page.

An example of page content is illustrated in the central portion 50 of FIG. 4.

These two operations take time but are to be performed only once for a counter corresponding to the capacity of a page.

During the counter operation (OPERATION), that is, its use by circuits 1 and 11 and more particularly during an increment thereof (block 47, COUNT+1), a programming (block 48, PROG BYTE 00) of the bits of the byte corresponding to value 0 (byte at value 00) is performed. Such a programming is performed rapidly in a flash memory, conversely to the erasing, since it is performed in bytes. In the example of FIG. 4, the current value is assumed to be 00011010. As illustrated in the central portion 50 of FIG. 4, this byte, as well as all the previous bytes through which the counter values have passed) then are at 0.

The initialization phase may be implemented each time the counter is needed to be reset.

For example, by using a counter over one byte (8 bits), a page of 256 flash memory bytes contains all the possible values of the counter.

In the case where the counter is over a larger number than contained in a byte, it is sufficient to use a plurality of pages and to concatenate the read values.

An advantage of the described embodiments is that they make the use of a flash memory possible to store the value of a counter.

Another advantage is that the counter update is fast, particularly as compared with the time required to erase a page from the flash memory.

Various embodiments have been described. Various alterations, modifications, and improvements will readily occur to those skilled in the art. In particular, the practical implementation of the described embodiments is within the abilities of those skilled in the art based on the functional indications given hereabove and by using circuits usual per se.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of operating a counter, comprising:
after programming a first value into a first location of a block of memory, programming a next progressive value into each subsequent location of the block of memory, each next progressive value being a next progressively different value than its predecessor; and
incrementing the counter by interrogating locations in the block of memory until a location having one of the next progressively different values is identified and programming a clearing value into the identified location having the one of the next progressively values.

2. A method of operating a counter according to claim 1, wherein the block of memory is in a flash memory.

3. A method of operating a counter according to claim 1, wherein the block of memory has 64 locations, 128 locations, or 256 locations.

4. A method of operating a counter according to claim 1, wherein the counter rolls over after every location in the block of memory has the clearing value.

5. A method of operating a counter according to claim 1, wherein each next progressive value is one more or one less than its predecessor.

6. A method of operating a counter according to claim 1, comprising:
erasing at least one page of the block of memory.

7. An electronic device, comprising:
a memory having a plurality of storage locations allocated to a counter including a first counter location, a last counter location and a plurality of counter locations between the first counter location and the last counter location; and
a counter circuit, the counter circuit arranged to initialize each of the plurality of storage locations to a different initialization value and the counter circuit arranged to increment the counter, the incrementing including:
beginning with the first counter location and working toward the last counter location, identifying a next counter location having one of the different initialization values; and
programming a clearing value into the identified next counter location.

8. An electronic device according to claim 7, wherein the memory is a flash memory in a wireless transceiver circuit.

9. An electronic device according to claim 8, wherein the wireless transceiver circuit conforms to a near field communications (NFC) protocol.

10. An electronic device according to claim 7, wherein the counter circuit is arranged to pre-initialize the plurality of storage locations by erasing at least one page of the memory.

11. An electronic device according to claim 7, wherein the counter is arranged to count from 0 to 255 or wherein the counter is arranged to count from 255 to 0.

12. An electronic device according to claim 7, wherein the plurality of storage locations allocated to the counter comprise N storage locations, N being an integer raised to a power of two.

13. A method to update a counter in a memory, comprising:
allocating N locations in the memory for the counter, each of the N locations representing a different sequential count value that the counter may take, the N locations beginning with a first location and ending with a last location;
initializing each of the N locations to a different initialized value; and
incrementing the counter, the incrementing including:
until a location having an initialized value is found, sequentially reading ones of the N locations in the memory from the first location toward the last location; and
programming a clearing value into the location having the initialized value that was found.

14. A method to update a counter in a memory according to claim 13, comprising:
reading the counter, the reading including sequentially reading ones of the N locations in the memory from the first location toward the last location until a location having one of the initialized values is found; and
returning the one of the initialized values that was found.

15. A method to update a counter in a memory according to claim 13, comprising:
reading the counter, the reading including identifying a first occurrence of a memory location having one of the initialized values; and
returning a value associated with the first occurrence of the memory location.

16. A method to update a counter in a memory according to claim 13, wherein the counter is arranged with N−2 locations between the first location and the last location.

17. A method to update a counter in a memory according to claim 13, wherein each of the N locations in the memory between the first location and the last location occupies a next sequential address of the memory.

18. A method to update a counter in a memory according to claim 13, wherein the counter is a count-down counter and each increment of the counter programs the clearing value into a sequentially lower address of the memory.

19. A method to update a counter in a memory according to claim 13, wherein the clearing value is not zero.

20. A method to update a counter in a memory according to claim 13, wherein initializing each of the N locations includes erasing at least one page of the memory.

* * * * *